(12) United States Patent
Tsai et al.

(10) Patent No.: US 10,545,596 B2
(45) Date of Patent: Jan. 28, 2020

(54) TOUCH DISPLAY DEVICE

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Han Lung Tsai, Shenzhen (CN); Ping Yang Chen, Shenzhen (CN)

(73) Assignees: Interface Technology (Chengdu) Co., Ltd., Chengdu, Sichuan (CN); Interface Optoelectronics (Shenzhen) Co., Ltd., Shenzhen, Guangdong (CN); General Interface Solution Limited, Maioli County (TW)

( * ) Notice: Subject to any disclaimer, the term of this patent is extended or adjusted under 35 U.S.C. 154(b) by 0 days.

(21) Appl. No.: 16/027,703

(22) Filed: Jul. 5, 2018

(65) Prior Publication Data
US 2019/0384435 A1 Dec. 19, 2019

(30) Foreign Application Priority Data
Jun. 14, 2018 (CN) .......................... 2018 1 0613358

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *H01L 27/323* (2013.01);
(Continued)

(58) Field of Classification Search
CPC .......... G06F 3/041; G06F 3/045; G06F 3/043; G06F 3/042; G01R 27/26; G06K 11/06; G08C 21/00
See application file for complete search history.

(56) References Cited

U.S. PATENT DOCUMENTS

| | | | |
|---|---|---|---|
| 8,441,583 B2 * | 5/2013 | Lee ......................... | G06F 3/041 349/12 |
| 2008/0150901 A1 * | 6/2008 | Lowles ............... | G02F 1/13338 345/173 |

(Continued)

*Primary Examiner* — Pegeman Karimi
(74) *Attorney, Agent, or Firm* — Rosenberg, Klein & Lee

(57) ABSTRACT

A touch display device includes a transparent substrate, a first transparent touch layer, a plurality of first conductive traces, a ring-shaped transparent insulation layer, a ring-shaped metal layer, a polarizer, a first optical adhesive layer, and a transparent cover. The first transparent touch layer is arranged on the transparent substrate, the first conductive traces are arranged on the bezel region of the transparent substrate, the ring-shaped transparent insulation layer covers the first conductive traces, and the ring-shaped metal layer is arranged on the ring-shaped transparent insulation layer. The polarizer is arranged on the transparent substrate and the ring-shaped metal layer to cover the first transparent touch layer. The first optical adhesive layer and the transparent cover are sequentially arranged on the polarizer.

10 Claims, 5 Drawing Sheets

(51) Int. Cl.
*H01L 27/32* (2006.01)
*H01L 51/52* (2006.01)
*H01L 51/00* (2006.01)

(52) U.S. Cl.
CPC ...... *H01L 51/0097* (2013.01); *H01L 51/5281* (2013.01); *G06F 2203/04111* (2013.01); *G06F 2203/04112* (2013.01); *H01L 2251/5338* (2013.01)

(56) References Cited

U.S. PATENT DOCUMENTS

| | | | |
|---|---|---|---|
| 2013/0076712 A1* | 3/2013 | Zheng | G01J 1/32 |
| | | | 345/207 |
| 2016/0209959 A1* | 7/2016 | Lee | G06F 3/044 |
| 2018/0199124 A1* | 7/2018 | Hecht | G06F 3/0436 |
| 2019/0131295 A1* | 5/2019 | Xin | H01L 27/0292 |
| 2019/0220115 A1* | 7/2019 | Mori | G06F 3/0446 |

* cited by examiner

TOUCH DISPLAY DEVICE

This application claims priority for China patent application no. 201810613358.X filed on Jun. 14, 2018, the content of which is incorporated by reference in its entirety.

BACKGROUND OF THE INVENTION

Field of the Invention

The present invention relates to a display device, particularly to a touch display device.

Description of the Related Art

In recent years, touch panels have been extensively applied in various types of electronic appliances, such as global positioning system (GPS), personal digital assistant (PDA), cellular phone, and hand-held personal computer (PC), to replace traditional input devices (keyboards and mice, for instance). This design greatly improves the accessibility of the interfaces of electronic apparatuses. In addition, since the traditional input devices are no longer required, there is more space for installing display panels of larger size, which makes it rather convenient for users to browse data.

In general, a touch panel is shown in FIG. 1. The touch panel includes a touch sensing layer 10, a polarizer 12, an optical adhesive layer 14, a decoration layer 16, and a transparent cover 18. The decoration layer 16 has a shape of a ring. The decoration layer 16 is formed above the bezel region of the touch sensing layer 10 to shield conductive traces of the bezel region of the touch sensing layer 10. As shown in FIG. 1, the polarizer 12, the optical adhesive layer 14, the decoration layer 16, and the transparent cover 18 are sequentially formed on the touch sensing layer 10. Besides, the polarizer 12 and the touch sensing layer 10 can exchange their positions. However, the decoration layer 16 will increase the thickness, process, and cost of the touch panel.

To overcome the abovementioned problems, the present invention provides a touch display device, so as to solve the afore-mentioned problems of the prior art.

SUMMARY OF THE INVENTION

A primary objective of the present invention is to provide a touch display device, which uses a ring-shaped metal layer as a decoration layer to reduce the overall thickness, process, and cost of the touch panel.

To achieve the abovementioned objectives, the present invention provides a touch display device, which comprises a transparent substrate, a first transparent touch layer, a plurality of first conductive traces, a ring-shaped transparent insulation layer, a ring-shaped metal layer, a polarizer, a first optical adhesive layer, and a transparent cover. The transparent substrate has a first surface and a second surface opposite to the first surface, and the transparent substrate is divided into a sensing region and a bezel region surrounding the sensing region. The first transparent touch layer is formed on the first surface of the sensing region and the bezel region of the transparent substrate. The plurality of first conductive traces are formed on the first transparent touch layer on the bezel region of the transparent substrate to electrically connect to the first transparent touch layer. The ring-shaped transparent insulation layer is formed on the first surface of the bezel region of the transparent substrate to cover the plurality of first conductive traces. The ring-shaped metal layer is formed on the ring-shaped transparent insulation layer. The polarizer is formed on the sensing region of the transparent substrate and the ring-shaped metal layer to cover the first transparent touch layer. The first optical adhesive layer is formed on the polarizer. The transparent cover is formed on the first optical adhesive layer.

In an embodiment of the present invention, the ring-shaped metal layer is formed directly over the plurality of first conductive traces.

In an embodiment of the present invention, the touch display device further comprises a patterned transparent insulation layer and a plurality of conductive bridges. The patterned transparent insulation layer is formed on the first transparent touch layer, and the patterned transparent insulation layer is penetrated with a plurality of holes to expose a part of the first transparent touch layer. The plurality of conductive bridges are formed on the patterned transparent insulation layer and electrically connected to the first transparent touch layer under the plurality of holes through the plurality of holes, and the polarizer is formed on the patterned transparent insulation layer and the plurality of conductive bridges to cover them.

In an embodiment of the present invention, the touch display device further comprises a second transparent touch layer and a plurality of second conductive traces. The second transparent touch layer is formed on the second surface of the sensing region and the bezel region of the transparent substrate. The plurality of second conductive traces are formed on the second transparent touch layer on the bezel region of the transparent substrate to electrically connect to the second transparent touch layer.

In an embodiment of the present invention, the ring-shaped metal layer is formed directly over the plurality of second conductive traces.

In an embodiment of the present invention, the touch display device further comprises a second optical adhesive layer and a light-emitting module. The second optical adhesive layer is formed on the second surface of the sensing region and the bezel region of the transparent substrate to cover the second transparent touch layer and the plurality of second conductive traces. The light-emitting module is formed on the second transparent touch layer and the plurality of second conductive traces through the second optical adhesive layer.

In an embodiment of the present invention, the touch display device further comprises a second optical adhesive layer and a light-emitting module. The second optical adhesive layer is formed on the second surface of the sensing region and the bezel region of the transparent substrate. The light-emitting module is formed on the second surface of the sensing region and the bezel region of the transparent substrate through the second optical adhesive layer.

In an embodiment of the present invention, the polarizer abuts against the inner sidewalls of the ring-shaped transparent insulation layer and the ring-shaped metal layer.

In an embodiment of the present invention, the transparent substrate is sideward extended to form a terminal region, the terminal region is provided with a conductive terminal thereon, the conductive terminal is provided a flexible printed circuit (FPC) thereon, one of the plurality of first conductive traces is extended to the terminal region to penetrate through the ring-shaped transparent insulation layer and electrically connect to the conductive terminal, the terminal region is bent to adhere the terminal region provided with the FPC to the light-emitting module through an adhesive.

In an embodiment of the present invention, the ring-shaped metal comprises CuNi or AlMo.

Below, the embodiments are described in detail in cooperation with the drawings to make easily understood the technical contents, characteristics and accomplishments of the present invention.

DETAILED DESCRIPTION OF THE INVENTION

Figure 1:
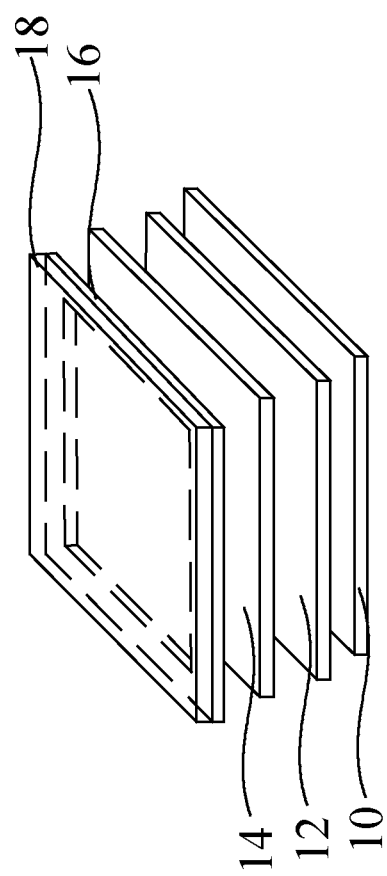
FIG. 1 is an exploded view of a touch panel in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 2:
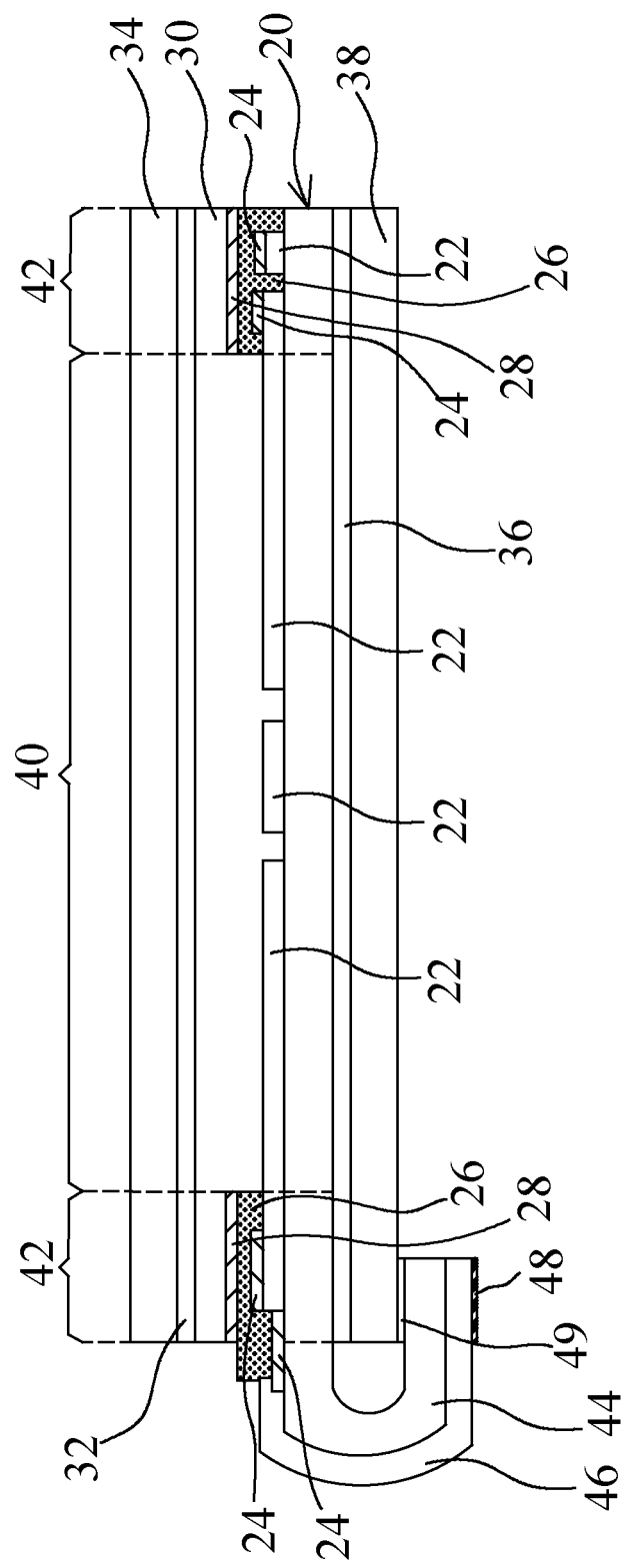
FIG. 2 is a cross-sectional view of a touch display device according to the first embodiment of the present invention.
Figure 3:
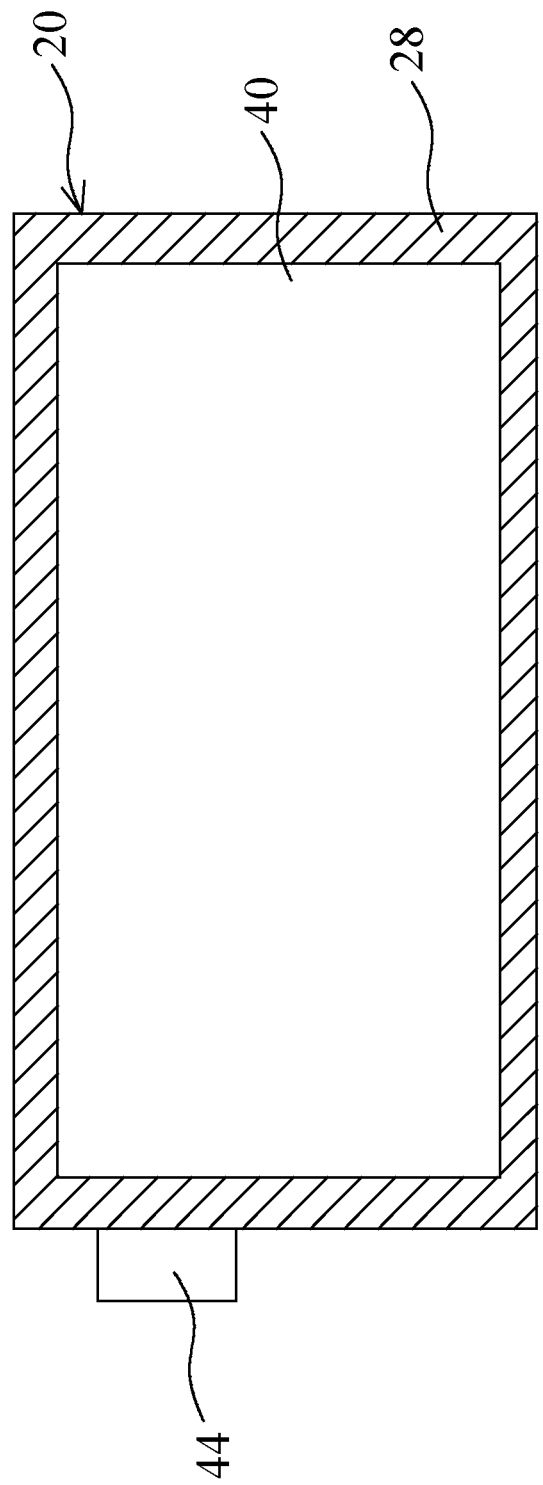
FIG. 3 is a diagram schematically showing relative positions of a transparent substrate and a ring-shaped metal layer according to an embodiment of the present invention.

Refer to FIG. 2 and FIG. 3. The first embodiment of the touch display device of the present invention is introduced as follows. The touch display device comprises a transparent substrate 20, a first transparent touch layer 22, a plurality of first conductive traces 24, a ring-shaped transparent insulation layer 26, a ring-shaped metal layer 28, a polarizer 30, a first optical adhesive layer 32, a transparent cover 34, a second optical adhesive layer 36, and a light-emitting module 38. In the first embodiment, the transparent substrate 20 may be a flexible transparent substrate, the first transparent touch layer 22 may be a metal mesh, the ring-shaped metal layer 28 may comprises CuNi or AlMo, and the light-emitting module 38 may be an organic light-emitting module. The transparent substrate 20 has a first surface and a second surface opposite to the first surface, and the transparent substrate 20 is divided into a sensing region 40 and a bezel region 42 surrounding the sensing region 40. The first transparent touch layer 22 is formed on the first surface of the sensing region 40 and the bezel region 42 of the transparent substrate 20. The plurality of first conductive traces 24 are formed on the first transparent touch layer 22 on the bezel region 42 of the transparent substrate 20 to electrically connect to the first transparent touch layer 22. The ring-shaped transparent insulation layer 26 is formed on the first surface of the bezel region 42 of the transparent substrate 20 to cover the plurality of first conductive traces 24. The ring-shaped metal layer 28 is formed on the ring-shaped transparent insulation layer 26 and directly over the plurality of first conductive traces 24. The polarizer 30 is formed on the sensing region 40 of the transparent substrate 20 and the ring-shaped metal layer 28 to cover the first transparent touch layer 22. The polarizer 30 abuts against the inner sidewalls of the ring-shaped transparent insulation layer 26 and the ring-shaped metal layer 28. The first optical adhesive layer 32 is formed on the polarizer 30. The transparent cover 34 is formed on the first optical adhesive layer 32. The second optical adhesive layer 36 is formed on the second surface of the sensing region 40 and the bezel region 42 of the transparent substrate 20. The light-emitting module 38 is formed on the second surface of the sensing region 40 and the bezel region 42 of the transparent substrate 20 through the second optical adhesive layer 36. In the conventional technology, grounding traces are formed outside the conductive traces. Since a grounding trace has a width and there is a gap between the grounding trace and the conductive traces, the width and the gap can increase the area of the bezel region of the touch display device. However, the ring-shaped metal layer 28 of the present invention is used as a grounding trace. Since the ring-shaped metal layer 28 and the first conductive traces 24 have different heights, the area of the bezel region 42 of the touch display device is reduced. Besides, the ring-shaped metal layer 28 is formed under the polarizer 30, the ring-shaped metal layer 28 is visually black and used as a decoration layer on the bezel region 42. The optical density (OD) of the ring-shaped metal layer 28 is larger than or equal to 3.

The transparent substrate 20 is sideward extended to form a terminal region 44, the terminal region 44 is provided with a conductive terminal 46 thereon, the conductive terminal 46 is provided a flexible printed circuit (FPC) 48 thereon, one of the plurality of first conductive traces 24 is extended to the terminal region 44 to penetrate through the ring-shaped transparent insulation layer 26 and electrically connect to the conductive terminal 46, the terminal region 44 is bent to adhere the terminal region 44 provided with the FPC 48 to the light-emitting module 38 through an adhesive 49. Thus, the indentation due to connecting the FPC 48 with the terminal region 44 is prevented from being seen.

Figure 4:
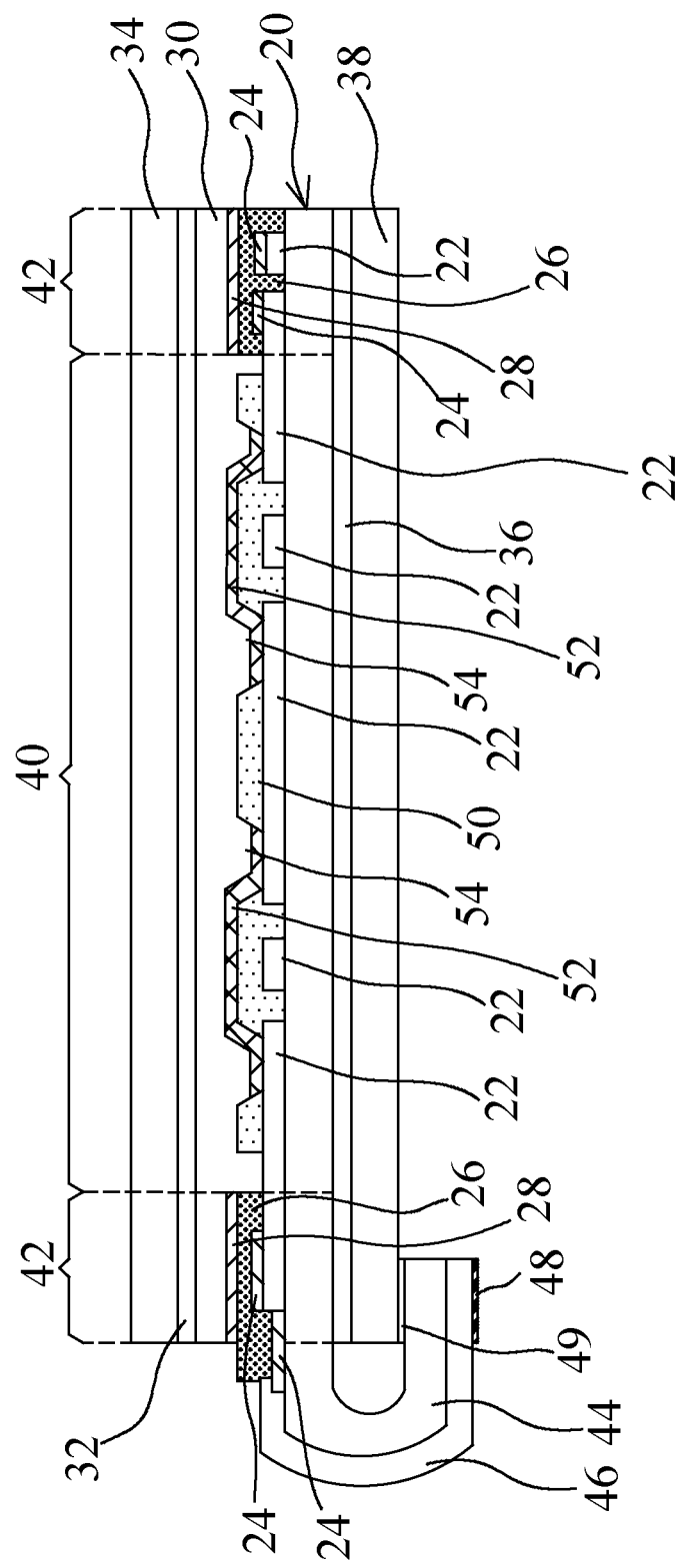
FIG. 4 is a cross-sectional view of a touch display device according to the second embodiment of the present invention.

Refer to FIG. 4. The second embodiment of the touch display device of the present invention is introduced as follows. The second embodiment is different from the first embodiment in that the second embodiment further comprises a patterned transparent insulation layer 50 and a plurality of conductive bridges 52. The patterned transparent insulation layer 50 is formed on the first transparent touch layer 22, and the patterned transparent insulation layer 50 is penetrated with a plurality of holes 54 to expose a part of the first transparent touch layer 22. The plurality of conductive bridges 52 are formed on the patterned transparent insulation layer 50 and electrically connected to the first transparent touch layer 22 under the plurality of holes 54 through the plurality of holes 54, and the polarizer 30 is formed on the patterned transparent insulation layer 50 and the plurality of conductive bridges 52 to cover them. In addition, the first transparent touch layer 22 comprises ITO.

Figure 5:
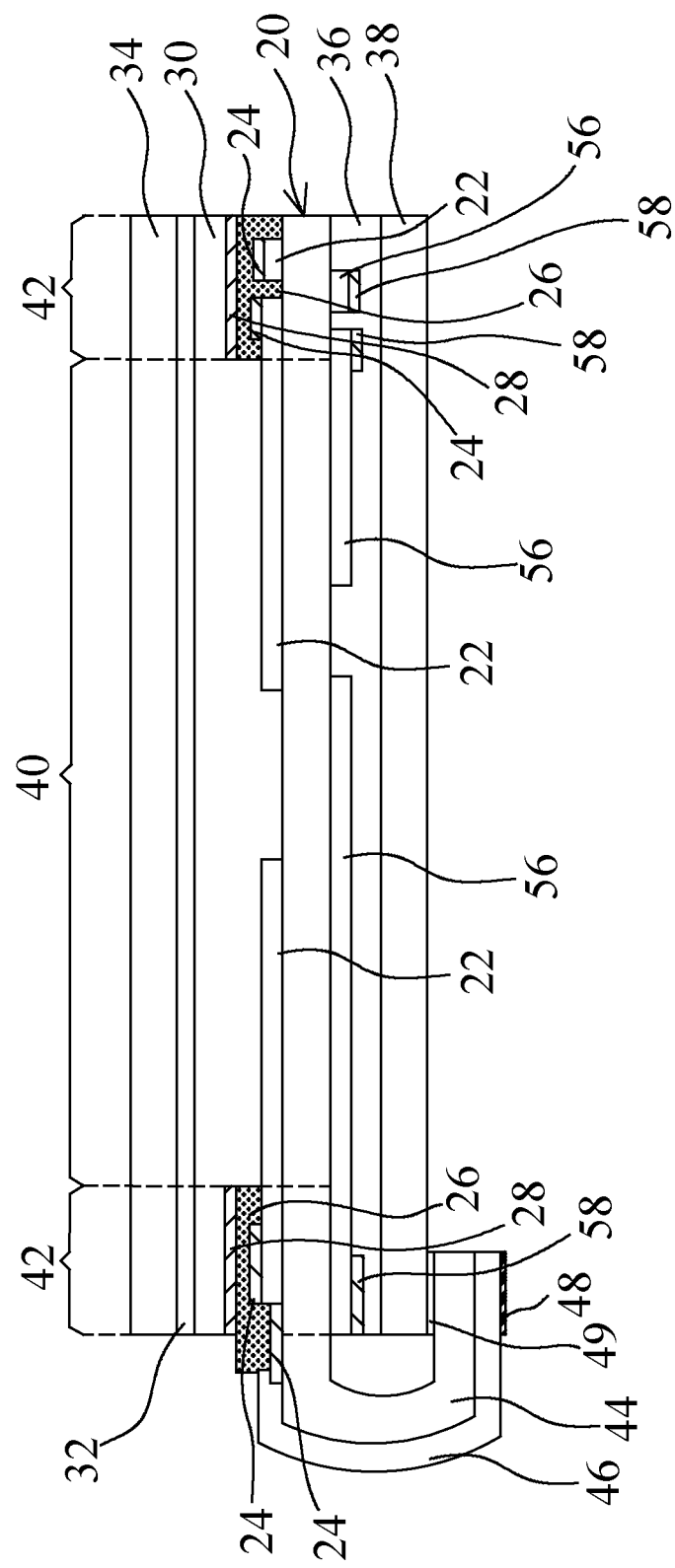
FIG. 5 is a cross-sectional view of a touch display device according to the third embodiment of the present invention.

Refer to FIG. 5. The third embodiment of the touch display device of the present invention is introduced as follows. The third embodiment is different from the second embodiment in that the third embodiment further comprises a second transparent touch layer 56 and a plurality of second conductive traces 58. The second transparent touch layer 56 also comprises ITO. The second transparent touch layer 56 is formed on the second surface of the sensing region 40 and the bezel region 42 of the transparent substrate 20. The plurality of second conductive traces 58 are formed on the second transparent touch layer 56 on the bezel region 42 of the transparent substrate 20 to electrically connect to the second transparent touch layer 56. The ring-shaped metal layer 28 is formed directly over the plurality of second conductive traces 58. The second optical adhesive layer 36 is formed on the second surface of the sensing region 40 and the bezel region 42 of the transparent substrate 20 to cover the second transparent touch layer 56 and the plurality of second conductive traces 58. The light-emitting module 38 is formed on the second transparent touch layer 56 and the plurality of second conductive traces 58 through the second optical adhesive layer 36.

In conclusion, the present invention uses the ring-shaped metal layer as a decoration layer to reduce the overall thickness, process, and cost of the touch panel.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A touch display device comprising:
    a transparent substrate having a first surface and a second surface opposite to the first surface, and the transparent substrate is divided into a sensing region and a bezel region surrounding the sensing region;
    a first transparent touch layer formed on the first surface of the sensing region and the bezel region of the transparent substrate;
    a plurality of first conductive traces formed on the first transparent touch layer on the bezel region of the transparent substrate to electrically connect to the first transparent touch layer;
    a ring-shaped transparent insulation layer formed on the first surface of the bezel region of the transparent substrate to cover the plurality of first conductive traces;
    a ring-shaped metal layer formed on the ring-shaped transparent insulation layer;
    a polarizer formed on the sensing region of the transparent substrate and the ring-shaped metal layer to cover the first transparent touch layer;
    a first optical adhesive layer formed on the polarizer; and
    a transparent cover formed on the first optical adhesive layer, and the polarizer abuts against inner sidewalls of the ring-shaped transparent insulation layer and the ring-shaped metal layer.

2. The touch display device according to claim 1, wherein the ring-shaped metal layer is formed directly over the plurality of first conductive traces.

3. The touch display device according to claim 1, further comprising:
    a patterned transparent insulation layer formed on the first transparent touch layer, and the patterned transparent insulation layer is penetrated with a plurality of holes to expose a part of the first transparent touch layer; and
    a plurality of conductive bridges formed on the patterned transparent insulation layer and electrically connected to the first transparent touch layer under the plurality of holes through the plurality of holes, and the polarizer is formed on the patterned transparent insulation layer and the plurality of conductive bridges to cover them.

4. The touch display device according to claim 1, further comprising:
    a second transparent touch layer formed on the second surface of the sensing region and the bezel region of the transparent substrate; and
    a plurality of second conductive traces formed on the second transparent touch layer on the bezel region of the transparent substrate to electrically connect to the second transparent touch layer.

5. The touch display device according to claim 4, further comprising:
    a second optical adhesive layer formed on the second surface of the sensing region and the bezel region of the transparent substrate to cover the second transparent touch layer and the plurality of second conductive traces; and
    a light-emitting module formed on the second transparent touch layer and the plurality of second conductive traces through the second optical adhesive layer.

6. The touch display device according to claim 5, wherein the transparent substrate sideward extended to form a terminal region, the terminal region is provided with a conductive terminal thereon, the conductive terminal is provided a flexible printed circuit (FPC) thereon, one of the plurality of first conductive traces is extended to the terminal region to penetrate through the ring-shaped transparent insulation layer and electrically connect to the conductive terminal, the terminal region is bent to adhere the terminal region provided with the FPC to the light-emitting module through an adhesive.

7. The touch display device according to claim 4, wherein the ring-shaped metal layer is formed directly over the plurality of second conductive traces.

8. The touch display device according to claim 1, further comprising:
    a second optical adhesive layer formed on the second surface of the sensing region and the bezel region of the transparent substrate; and
    a light-emitting module formed on the second surface of the sensing region and the bezel region of the transparent substrate through the second optical adhesive layer.

9. The touch display device according to claim 8, wherein the transparent substrate sideward extended to form a terminal region, the terminal region is provided with a conductive terminal thereon, the conductive terminal is provided a flexible printed circuit (FPC) thereon, one of the plurality of first conductive traces is extended to the terminal region to penetrate through the ring-shaped transparent insulation layer and electrically connect to the conductive terminal, the terminal region is bent to adhere the terminal region provided with the FPC to the light-emitting module through an adhesive.

10. The touch display device according to claim 1, wherein the ring-shaped metal layer comprises CuNi or AlMo.

* * * * *